(12) United States Patent
van Gemert et al.

(10) Patent No.: US 9,953,903 B2
(45) Date of Patent: Apr. 24, 2018

(54) HEATSINK VERY-THIN QUAD FLAT NO-LEADS (HVQFN) PACKAGE

(71) Applicant: NXP B.V., Eindhoven (NL)

(72) Inventors: Leonardus Antonius Elisabeth van Gemert, Nijmegen (NL); Tonny Kamphuis, Nijmegen (NL); Rintje van der Meulen, Wijchen (NL); Emil Casey Israel, Brueggen (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/806,526

(22) Filed: Jul. 22, 2015

(65) Prior Publication Data

US 2017/0025334 A1    Jan. 26, 2017

(51) Int. Cl.
*H01L 23/495*    (2006.01)
*H01L 21/48*    (2006.01)
(Continued)

(52) U.S. Cl.
CPC .... *H01L 23/49568* (2013.01); *H01L 21/4821* (2013.01); *H01L 21/4882* (2013.01); *H01L 21/565* (2013.01); *H01L 21/78* (2013.01); *H01L 23/3157* (2013.01); *H01L 23/3675* (2013.01); *H01L 23/4334* (2013.01); *H01L 23/49503* (2013.01); *H01L 23/49541* (2013.01); *H01L 24/32* (2013.01); *H01L 24/49* (2013.01); *H01L 24/73* (2013.01); *H01L 24/83* (2013.01); *H01L 24/85* (2013.01); *H01L 24/92* (2013.01); *H01L 24/97* (2013.01); *H01L 21/561* (2013.01); *H01L 23/3107* (2013.01); *H01L 23/49513* (2013.01); *H01L 23/49548* (2013.01); *H01L 2224/32245* (2013.01); *H01L 2224/45014* (2013.01); *H01L 2224/45015* (2013.01);
(Continued)

(58) Field of Classification Search
None
See application file for complete search history.

(56) References Cited

U.S. PATENT DOCUMENTS 5,293,301 A    3/1994   Tanaka et al.
5,583,377 A   12/1996   Higgins, III
(Continued)

OTHER PUBLICATIONS

Extended European Search Report dated Jan. 5, 2017 from EP Application No. 16180307.7.

*Primary Examiner* — Daniel Whalen

(57) ABSTRACT

Consistent with an example embodiment, there is a method for preparing an integrated circuit (IC) device having enhanced heat dissipation. The method comprises providing a lead frame array, of a first thickness, with a plurality of die placement areas each die placement area with bond pad landings, the bond bad landings situated about a die placement area on one or multiple sides, the bond pad landings having upper surfaces and opposite lower surfaces, placing a heat sink assembly of a second thickness, having at least two mounting tabs of the first thickness, in each die placement area and attaching the at least two mounting tabs onto corresponding bond pad landings serving as anchor pads, die bonding a device die on the heat sink device assembly, conductively bonding device die bond pads to corresponding bond pad landings, and encapsulating the wire bonded device die, heat sink assembly and lead frame array in a molding compound.

11 Claims, 6 Drawing Sheets

(51) Int. Cl.
*H01L 23/433* (2006.01)
*H01L 21/78* (2006.01)
*H01L 23/31* (2006.01)
*H01L 23/367* (2006.01)
*H01L 23/00* (2006.01)
*H01L 21/56* (2006.01)

(52) U.S. Cl.
CPC ........... *H01L 2224/48247* (2013.01); *H01L 2224/73265* (2013.01); *H01L 2224/838* (2013.01); *H01L 2224/8384* (2013.01); *H01L 2224/83801* (2013.01); *H01L 2224/83805* (2013.01); *H01L 2224/92247* (2013.01); *H01L 2924/0105* (2013.01); *H01L 2924/01029* (2013.01); *H01L 2924/14* (2013.01)

(56) References Cited

U.S. PATENT DOCUMENTS

| | | | |
|---|---|---|---|
| 6,246,111 B1 | 6/2001 | Huang et al. | |
| 2001/0003372 A1 | 6/2001 | Huang et al. | |
| 2009/0309213 A1* | 12/2009 | Takahashi | H01L 21/561 257/707 |
| 2012/0241934 A1* | 9/2012 | Miyake | H01L 23/49541 257/676 |
| 2012/0248590 A1* | 10/2012 | Liu | H01L 21/568 257/676 |
| 2012/0264258 A1* | 10/2012 | Luo | H01L 24/97 438/113 |

\* cited by examiner

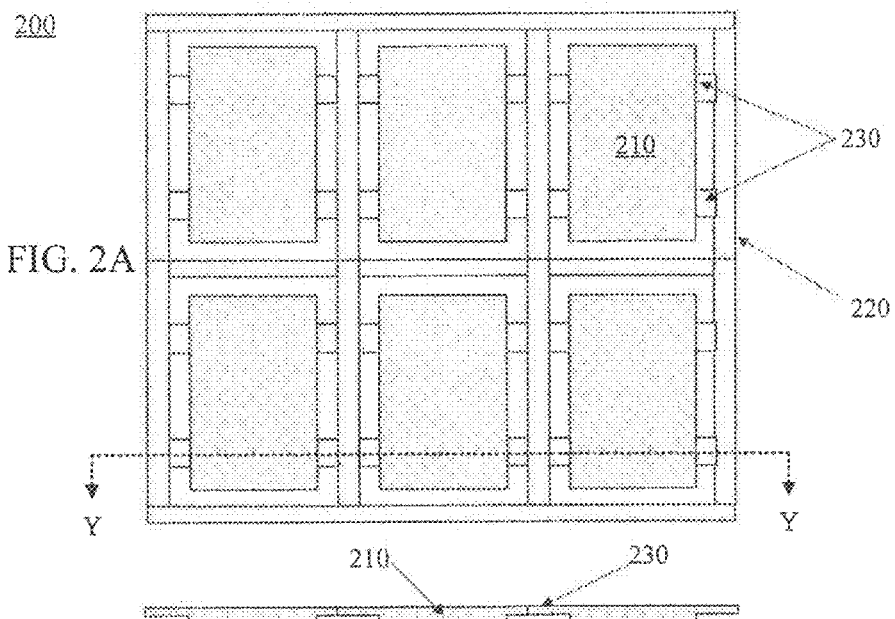
FIG. 2A
FIG. 2B
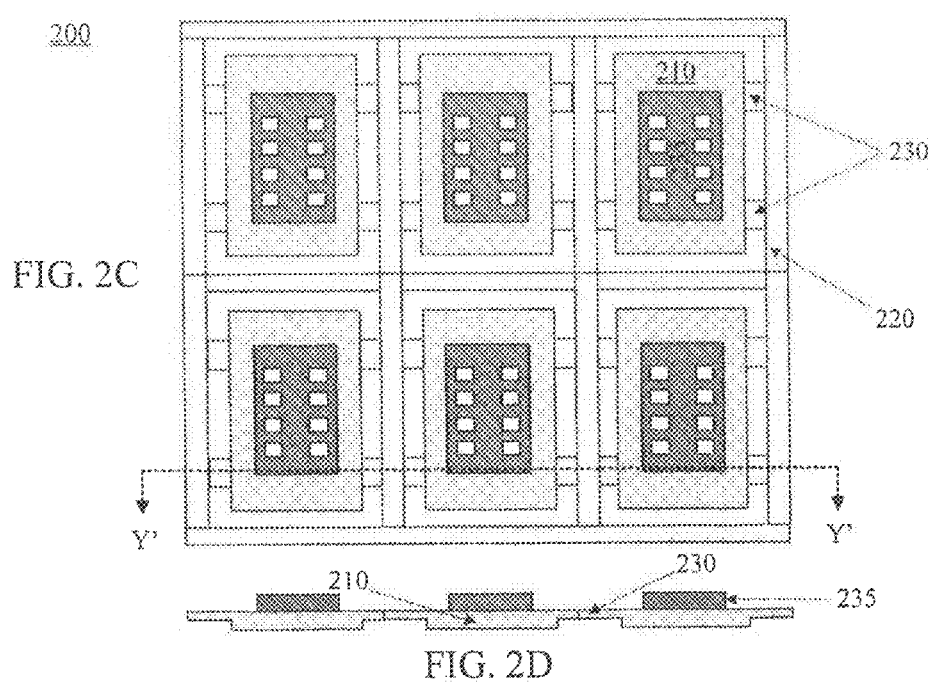
FIG. 2C
FIG. 2D

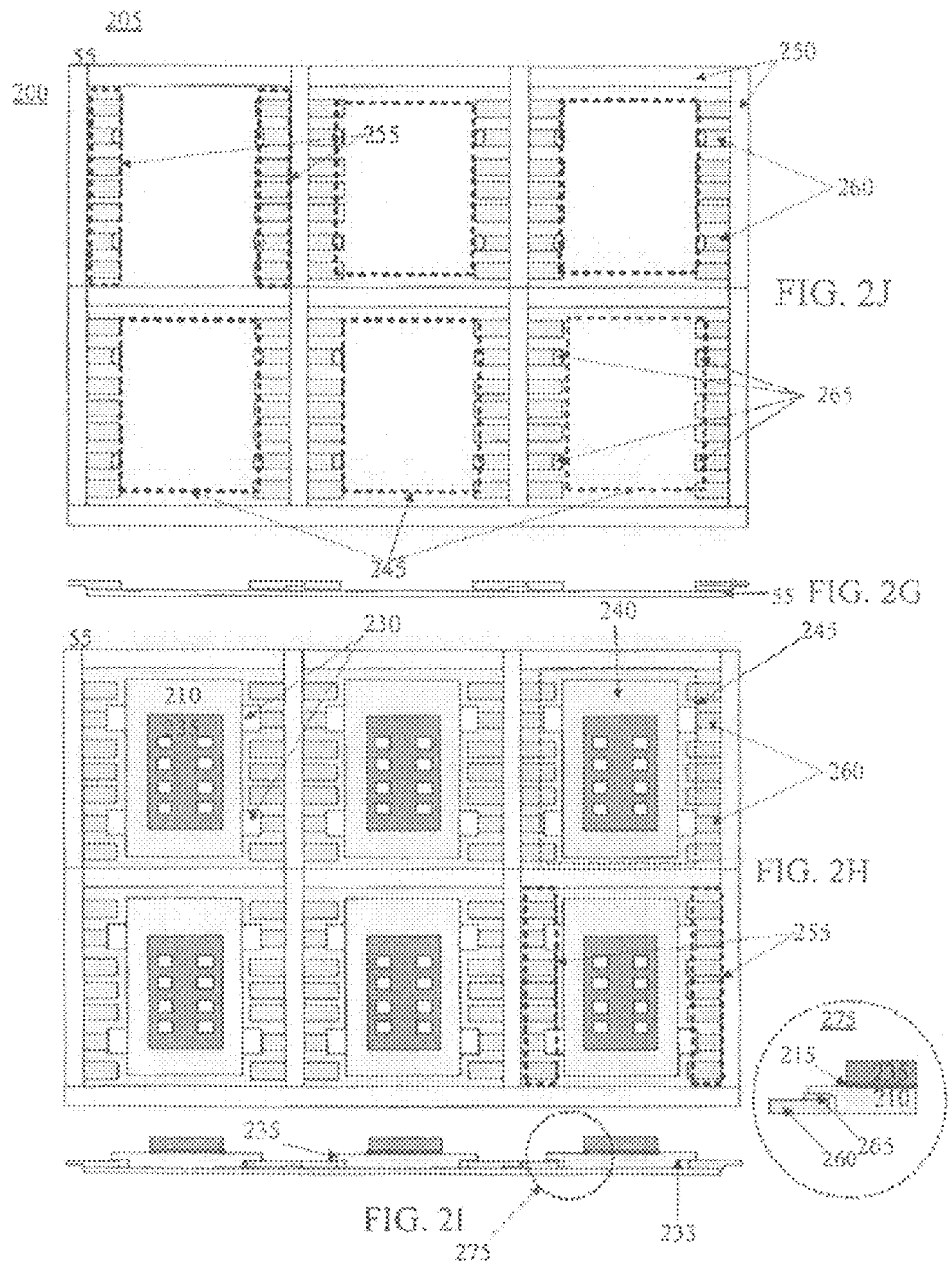

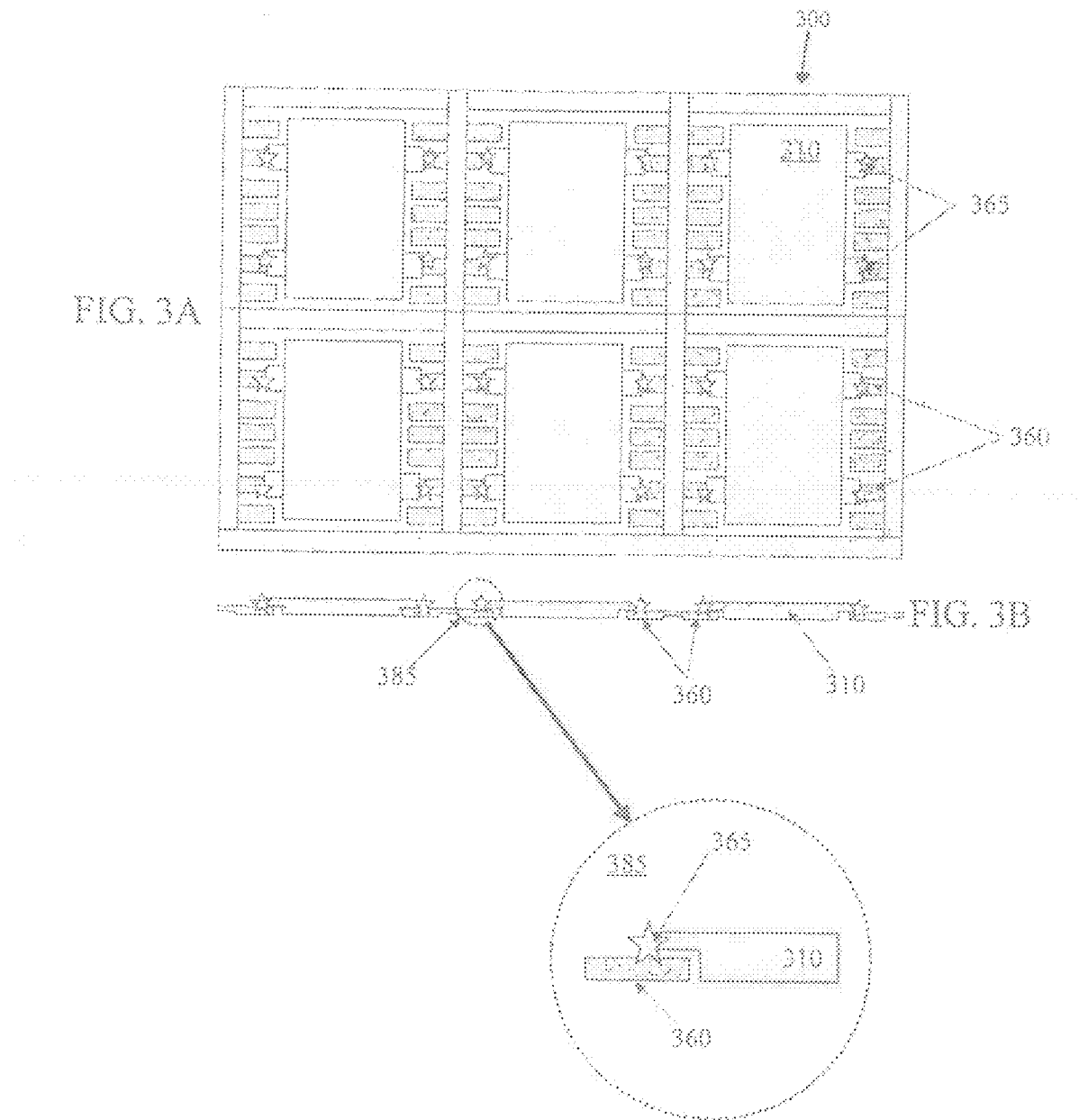

HEATSINK VERY-THIN QUAD FLAT NO-LEADS (HVQFN) PACKAGE

FIELD

This disclosure relates to integrated circuit (IC) packaging. More particularly, this disclosure relates to HVQFN or other exposed-pad non-leaded packaging, having a heat spreader.

BACKGROUND

The electronics industry continues to rely upon advances in semiconductor technologies to realize higher-function devices in more compact areas. Applications realizing higher-functioning devices require integrating a large number of electronic devices into a single silicon wafer. As the number of devices per given area of the silicon wafer increases, the manufacturing process becomes more difficult.

Many varieties of semiconductor devices have been manufactured having various applications in numerous disciplines. Such silicon-based semiconductor devices often include metal-oxide-semiconductor field-effect transistors (MOSFET), such as p-channel MOS (PMOS), n-channel MOS (NMOS) and complementary MOS (CMOS) transistors, bipolar transistors, BiCMOS transistors. Such MOSFET devices include an insulating material between a conductive gate and silicon-like substrate; therefore, these devices are generally referred to as IGFETs (insulated-gate FET).

In the manufacture of electronic devices on a wafer substrate, a particular challenge is to package these devices for their given purpose.

SUMMARY

The present disclosure addresses the challenge of making a QFN semiconductor having a lower vertical profile with enhanced thermal performance. In power applications, a thick heatsink in the package is used to dissipate the heat over a larger contact area toward a printed circuit board (PCB). In the SMD (Surface Mount Device) mounting of devices onto the PCB, the heatsink decreases the average thermal resistance between the package and the board, thereby reducing the effects of solder voids which may result from the mounting process.

One proposed solution to the heat dissipation problem is to use thicker QFN lead frames. However, the standard QFN production equipment cannot handle these thicker frames. Further, the availability of thicker QFN frames is a continuing challenge. Even if available, the singulation of thick copper lead frames is difficult and adds difficulties in maintaining consistent quality which increases production costs. The stiffness of the frames makes it difficult to maintain consistent flatness. An alternative may be the use of dual-gauge (i.e., portions of the lead frame are one thickness, other portions are a second thickness). However, this alternative is significantly more costly and is not a practical solution.

In addition, the present disclosure addresses a long-felt need to decouple the die-bonding conditions from their detrimental effects on lead frame and/or carrier. For high-temperature die-bonding, these effects can include oxidation of the lead frame surface, causing problems with mold adhesion or wire bonding, or adhesive decomposition in the case of a tape-based carrier.

Furthermore, the exposed heat sink underside provides for a high-integrity electrical connection between the device die and printed circuit board (PCB) to which it is soldered.

In an example embodiment, there is a method for preparing an integrated circuit (IC) device having enhanced heat dissipation. The method comprises providing a heat sink array having a top-side surface and an under-side surface, the heat sink array having a plurality of heat sink portions with at least two mounting tabs, the plurality of heat sink portions held fixedly together in the heat sink array by the at least two mounting tabs coupled by connecting bars to one another, each heat sink portion having a die placement area on the top-side surface. The plurality of heat sink portions is of a first thickness and the mounting tabs and the connecting bars are of a second thickness, the first thickness about twice that of the second thickness. A plurality of active device die is die-bonded onto the die placement areas in the plurality of heat sink portions, thereby forming a plurality of device die/heat sink assemblies. A sawing through of the connecting bars singulates the plurality of device die/heat sink assemblies into individual heat sink device assemblies.

In another example embodiment, an integrated circuit (IC) has enhanced heat dissipation. The IC comprises an active device die having a top-side surface and an under-side surface, a bondable die-attach layer on the under-side surface of the active device die, and a heat sink assembly having a top-surface and an opposite under-side surface to accommodate the active device die, wherein the active device die is bonded to the top-side surface of the heat sink assembly via the bondable die-attach layer and wherein the heat sink assembly has at least two mounting tabs, the mounting tabs are of a first thickness and the heat sink assembly is of a second thickness, the first thickness about half of the second thickness. A lead frame has a top-side surface and an opposite under-side surface, the lead frame has pad landings surrounding the active device and heat sink assembly, wherein conductive bonds connect active device die bond pads to the pad landings on the lead frame, wherein the at least two mounting tabs are anchored onto corresponding pad landings serving as anchor pads. An encapsulant envelopes the active device die, heat sink assembly, and lead frame; the underside surface of the lead frame and the under-side surface of the heat sink assembly are exposed and are coplanar.

In an example embodiment, there is a method for preparing an integrated circuit (IC) device having enhanced heat dissipation. The method comprises providing a lead frame array, of a first thickness, with a plurality of die placement areas each die placement area with bond pad landings, the bond pad landings situated about a die placement area on one or multiple sides, the bond pad landings having upper surfaces and opposite lower surfaces; placing a heat sink assembly of a second thickness, having at least two mounting tabs of the first thickness, in each die placement area and attaching the at least two mounting tabs onto corresponding bond pad landings serving as anchor pads. A device die is bonded on the heat sink device assembly and device die bond pads are conductively bonded to corresponding bond pad landings. The wire bonded device die, heat sink assembly and lead frame array are encapsulated in a molding compound.

The above summaries of the present invention are not intended to represent each disclosed embodiment, or every aspect, of the present invention. Other aspects and example embodiments are provided in the figures and the detailed description that follow.

BRIEF DESCRIPTION OF THE DRAWINGS

The invention may be more completely understood in consideration of the following detailed description of various embodiments of the invention in connection with the accompanying drawings, in which:

FIGS. 2A-2J are various views of matrix heat sink frame assembled with device die in accordance with the present disclosure; and FIGS. 3A-3B are views of an exposed heat sink HVQFN package assembled in accordance with the present disclosure.

Figure 1:
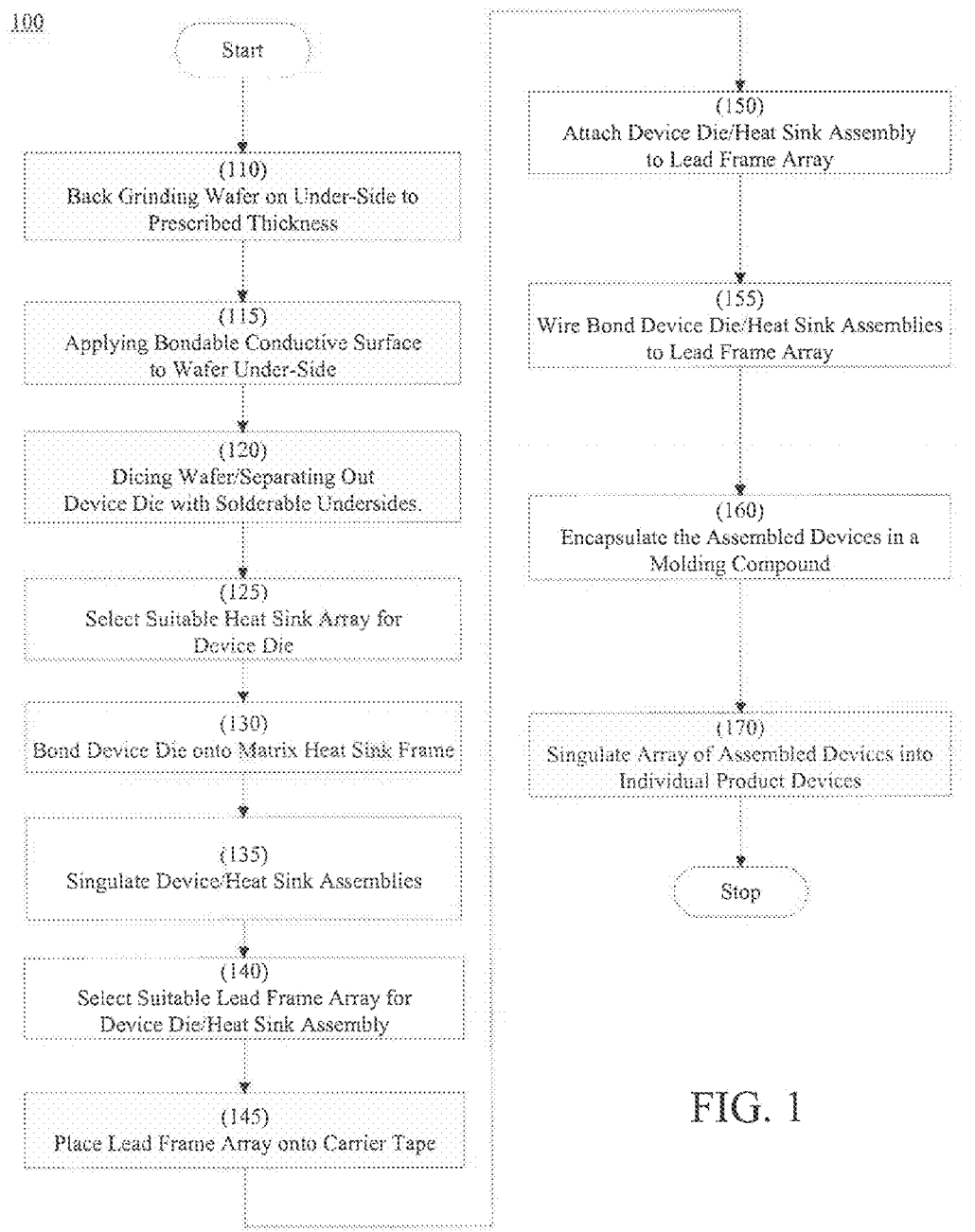
FIG. 1 is a flow diagram of an example assembly process in accordance with the present disclosure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

As the complexity of portable systems increases, there is a commensurate need to reduce the size of the individual components that make up the system; the system often is laid out on a printed circuit substrate. One way to reduce the size of individual components is through techniques that reduce the size of packages containing these devices. A package, often used, is the QFN (quad flat no-leads) package to reduce the vertical profile of the devices attached to the system printed circuit substrate. However, some applications may require that the QFN device handle sufficient power that may thermally stress the device die and packaging. Consequently, a heat sink is required to dissipate any excess heat; yet, the heat sink cannot add appreciably to the vertical profile. There is a need for a QFN or similar package that can accommodate a device die with a heat sink with an acceptable profile.

The present disclosure has been found useful in enhancing the heat dissipation characteristics a power FET device assembled in a HVQFN package. These devices may be expected to dissipate about 100 mW to about 5 W, or more.

Example devices may range in size from 3×3 mm up to 20×20 mm. A heat sink array would be a HVQFN strip size of about 70×250 mm (or slight smaller so that it can be accommodated on the 200 mm sawing system.

Thus, depending on heat sink size this tooling could hold something in the range of 50 (for larger package size) to 2500 for (smaller package size). The number of pins may range from minimal 3 pins (including the heat sink) to about 100, as in an example combining of a power device and controller in one package. The heat sink size will depend upon the power handling requirements of the particular device.

In an example process the wafers are ground down to about 200 µm to prepare the device die that will ultimately be assembled onto the heat sink. To further reduce vertical profile, in another example process, the back grind thickness may be reduced down to 50 µm, after this process the back side metallization is applied. This metallization is in the order of a few micro-meters. One, or more metallization deposition techniques may be applied or even a combination of them (e.g., initial sputter layer which is increased in thickness by a plating process). The metallization provides a solderable surface on the die back side for optimal thermal (and electrical) contact of the die to the heat sink. Glue die bonding is possible also but will in general have a lower thermal contact.

The present disclosure obviates the need to attach a separate heat sink to the QFN package in that the underside of the package is in direct contact with the PCB; the PCB provides a large area in which heat may be dissipated. Having prepared the underside of the devices, the attaching of the device die to the heat sink portion prior to assembly in a QFN lead frame, provides for better heat spreading that for a device die packaging in a conventional QFN configuration.

Making reference to FIG. 1, in an example process 100 according to the disclosure, a wafer substrate on its underside undergoes back-grinding to a prescribed thickness 110. After back grinding, a suitable bondable conductive surface is applied to the wafer's under-side 115. The bondable conductive surface may be applied with a variety of techniques, which may include, but are not limited to, sputtering, evaporation, chemical vapor deposition, electro-plating, or a combination thereof. Bondable conductive surfaces may include NiAu, Cu, NiAg, or other suitable alloys. After the wafer under-side of the wafer is coated, the wafer is diced and device die, having bondable under-sides, are separated out 120. Dicing of the wafer may be accomplished with sawing, cleaving, laser ablation or other suitable method.

In another example process, the device die having a bondable underside surfaces may be prepared, in advance, in a separate process or from a third party. The prepared device die are bonded to the heat sink array, as described in the present disclosure.

This bondable surface is only needed in case of soldering and when good electrical contact to the Si back side is needed. Alternatively for a glue die bonding a bondable back side in the form of metallization is acceptable, as long as a suitable thermal conductive glue is used with proper adhesion to the Si die.

As determined by the device die type, a heat sink array is prepared 125. Having prepared the heat sink array, device die are bonded in die-attach areas on the heat sink array 130. The device die, having solderable undersides, may be re-flow soldered onto the die attach areas of the heat sink array 125. In the present disclosure, heat sinks are arrayed in a heat sink frame (HS). The HS array permits the use of high-temperature die-bonding. The lead frame is spared from deleterious effects of the process temperatures, the effects including lead frame oxidation which may result in poor molding compound adhesion or wire-bonding problems. Also for HVQFN often mold tape is used during assembly; the mold tape cannot withstand temperature greater than 180° C. for more than a few minutes. The user may make use of higher-temperature die-attach techniques which may include, but are not necessarily limited to, solder, eutectic, silver (Ag)-sinter, conductive adhesive, etc. For example, Ag-sinter is performed at about 200° C. to about 300° C., Pb-solder at about 350° C., eutectic at about 400° C., and conductive adhesive at 150° C. to 250° C.

Further, the high temperatures may not be compatible with use of adhesive carrier tape; the high temperatures degrade the tape.

The heat sink array with attached device die is placed on dicing foil and singulated (by sawing) into individual assemblies 135. For the type of device die/heat sink assembly, a suitable lead frame array is selected 140. For example, an eight-pin device would require a lead frame of at least eight pad landings corresponding to each pin of the device, as well as contact areas for the heat sink attachment. Onto carrier tape, the lead frame array along with the device die/heat sink assemblies are placed 145. The device die/heat sink assembly is attached to a lead frame 150. Mounting locations on the lead frame have glue or other attachment means to provide a bond to mounting tabs on the heat sink.

Devices are wire bonded to the bond pad areas on the lead frame array 155. The array of device die/heat sink assemblies and the lead frame array are encapsulated in a molding compound 160.

In another example embodiment, the die/heat sink assembly might be attached to the mold tape alone (without connection to the lead frame bonding tabs).

After wire bonding and encapsulation, the carrier tape is removed. The assembled array of encapsulated devices is then sawed apart into individual assembled devices whose lead frame contacts are exposed, as well, as the exposed heat sink 170; these exposed contact areas would be coplanar. The heat sink and exposed lead frame contacts would be prepared appropriately so that they have surfaces with a sufficient affinity to solder.

In another example embodiment, the use of wire bonds may not be appropriate, especially were minimizing interconnect inductance and/or resistance is critical. Ribbon bonding may often be used. For a given application, a wire bond may have a given diameter of about 25.4 μm (0.001 in) and a ribbon bond may have a cross-section of about 25.4 μm×76.2 μm (0.001 in×0.003 in). Interconnect inductance can cause impedance mismatches, ringing, distortion pulses. For high speed circuits, excess inductance results in reduced bandwidth. Because of this need for reduced inductance, ribbon bonding may often be specified instead of wire bonding. This is especially true for wide band components where parameters such as group delay must be controlled over a very wide bandwidth. Ribbon bonds may be preferred because a typical ribbon bond has two to three times less inductance than that of a wire bond. The increased cross-sectional area serves to lower the resistance of typical ribbon bonds compared to typical wire bonds, which in turn lowers $R_{DSon}$ in relevant electrical pathways. More detailed information may be found in "Quick Reference Guide: Ribbon Bond vs. Wire Bond." NATEL Engineering Co., Inc., Chatsworth, Calif., USA, pp. 4.

The device die/heat sink assemblies may be configured as strips, for example, 50 mm×150 mm or 100 mm×300 mm. Die sizes which may be used range from about 1 mm×1 mm to about 20 mm×20 mm. The number of device pins may range from 2 to 50 or more.

Figures 2E, 2F:
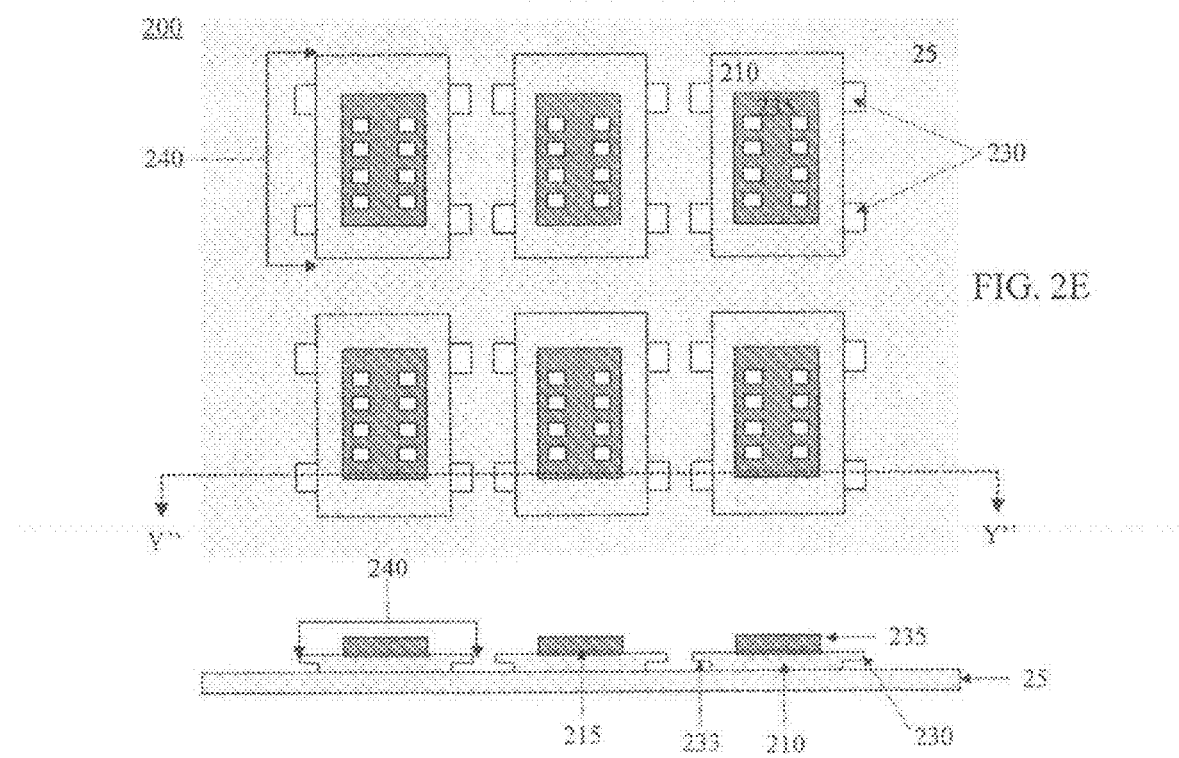
Figure 4:
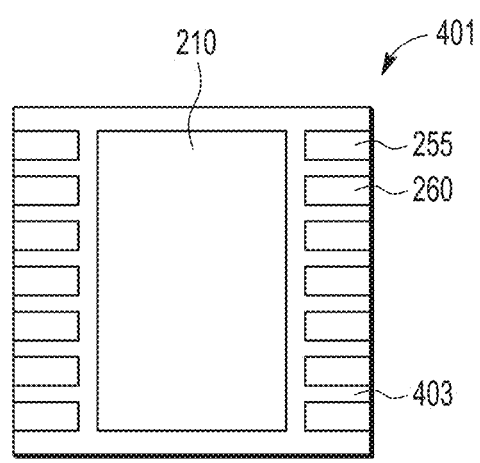
FIG. 4 is a bottom view of a singulated device according to one embodiment of the present invention.

In an example embodiment, as depicted in FIGS. 2A-2J, a series of views illustrate the assembly of a device die according to the disclosure. FIGS. 2A-2B show heat sink array 200 in a frame. Although the figures illustrate an array of two rows and three columns, (for a total of six devices) such arrays used in IC device production may be hundreds of rows and columns of thousands of device positions. Individual heat sinks 210 with mounting tabs 230 are arrayed in a frame 220. FIGS. 2C-2D show device die 235 attached to each heat sink position. The device die 235 may be soldered (e.g., soft-soldered, eutectic soldered, or copper/tin soldered, etc.) or attached with conductive adhesive 215 to the heat sink array position 210. The heat sink array is roughly twice the thickness of an actual QFN lead frame and is half-etched on underside surfaces of connecting bars 250 and the underside surfaces 233 of the mounting tabs 230. In an example package, the heat sink is about 0.4 mm thick and half-etched to about 0.2 mm. After the device die 235 are mounted, the heat sink array 200 is mounted onto a dicing foil 25.

Refer to FIGS. 2E-2F. The half-etched areas of the heat sink array 200 are sawed to obtain individual device/heat sink assemblies 240.

Refer to FIGS. 2G and 2J. An example lead frame assembly 205 has an array of six positions. The lead frame assembly 205 is mounted onto a sawing/dicing tape 55. Connection bars 250 maintain the geometric relationships between the bond pads 255, so as to define device positions 245. The bond pads 255 ultimately are the I/O terminals of the finished device. Four anchor pads 260 (which are selected from bond pads 255) in each device position 245 are prepared with spots 265 of glue or solder paste to attach the underside surfaces 233 the mounting tabs 230 of the device/heat sink assemblies 240.

Refer to FIGS. 2H-2I. The individual device/heat sink assemblies 240 are mounted in each device position 245. The mounting tabs 230 are mounted to anchor pads 260. The magnified view 275 of the device mounting shows the anchor tab 260 upon which glue or solder 265 is applied. The mounting tab 230 is anchored to tab 260 with glue or solder 265. Device die 210 is attached to the heat sink 210 with a solder type attachment 215.

The individual device/heat sink assemblies 240 are wire bonded. The wire bonded devices are encapsulated in a molding compound. The lead frame connection bars 250 are removed during singulation. The underside surfaces of bond pads 255, anchor pads 260, and heat sink 210 facilitate mounting of the device onto a system printed circuit board.

Refer to FIGS. 3A-3B. In an example embodiment according to the present disclosure, in a lead frame array 300, a heat sink 310 at chosen locations 365, may be riveted or laser welded at anchor pads 360.

The number of fabricated devices can range from several hundred to even several thousand pieces. QFN package sizes may range from millimeters on a side down to about 0.5 mm×1 mm. Other leadless (metal-based) packages may include, but are not necessarily limited to, aQFN (advanced quad flat no lead), LLGA (leadless land grid array), TLA (thermal leadless array), EFLGA (electroforming type land grid array), and TLEM (transcription lead of electroforming method), etc. The embodiments in the present disclosure may also be implemented in exposed-pad leaded devices such as HSOP (heat slug outline package), HQFP (heatsink quad flat pack) or other similar package types.

Having been able to apply higher temperature processing to the die attach process in the die attaching of the device die onto the heat sink portion, a QFN device is assembled having a greater power dissipation performance and improved reliability. The die attach process occurs separately and thus, QFN lead frame or carrier is spared from the effects of the die attach process.

Various exemplary embodiments are described in reference to specific illustrative examples. The illustrative examples are selected to assist a person of ordinary skill in the art to form a clear understanding of, and to practice the various embodiments. However, the scope of systems, structures and devices that may be constructed to have one or more of the embodiments, and the scope of methods that may be implemented according to one or more of the embodiments, are in no way confined to the specific illustrative examples that have been presented. On the contrary, as will be readily recognized by persons of ordinary skill in the relevant arts based on this description, many other configurations, arrangements, and methods according to the various embodiments may be implemented.

To the extent positional designations such as top, bottom, upper, lower have been used in describing this disclosure, it will be appreciated that those designations are given with reference to the corresponding drawings, and that if the orientation of the device changes during manufacturing or operation, other positional relationships may apply instead. As described above, those positional relationships are described for clarity, not limitation.

The present disclosure has been described with respect to particular embodiments and with reference to certain drawings, but the invention is not limited thereto, but rather, is set forth only by the claims. The drawings described are only schematic and are non-limiting. In the drawings, for illustrative purposes, the size of various elements may be exaggerated and not drawn to a particular scale. It is intended that this disclosure encompasses inconsequential variations in the relevant tolerances and properties of components and modes of operation thereof. Imperfect practice of the invention is intended to be covered.

Where the term "comprising" is used in the present description and claims, it does not exclude other elements or steps. Where an indefinite or definite article is used when referring to a singular noun, e.g. "a" "an" or "the", this includes a plural of that noun unless something otherwise is specifically stated. Hence, the term "comprising" should not be interpreted as being restricted to the items listed thereafter; it does not exclude other elements or steps, and so the scope of the expression "a device comprising items A and B" should not be limited to devices consisting only of components A and B. This expression signifies that, with respect to the present disclosure, the only relevant components of the device are A and B.

Numerous other embodiments of the disclosure will be apparent to persons skilled in the art without departing from the spirit and scope of the disclosure as defined in the appended claims.

What is claimed is:

1. A method for preparing an integrated circuit (IC) device, the method comprising:
   providing a heat sink array having a top-side surface and an under-side surface, the heat sink array having a plurality of heat sink portions with at least two mounting tabs, the plurality of heat sink portions held fixedly together in the heat sink array by the at least two mounting tabs coupled by connecting bars to one another, each heat sink portion having a die placement area on the top-side surface;
   wherein, the plurality of heat sink portions is of a first thickness and the mounting tabs and the connecting bars are of a second thickness, the first thickness about twice that of the second thickness;
   die bonding a plurality of active device die onto the die placement areas in the plurality of heat sink portions, thereby forming a plurality of device die/heat sink assemblies;
   sawing through the connecting bars so as to singulate the plurality of device die/heat sink assemblies into individual heat sink device assemblies;
   providing a lead frame array with a plurality of die placement areas each die placement area with bond pad landings, the bond pad landings situated about the each die placement area on one or multiple sides, the bond pad landings having upper surfaces and opposite lower surfaces;
   placing a heat sink device assembly of the individual heat sink device assemblies in a die placement area of the plurality of die placement areas of the lead frame array and attaching the at least two mounting tabs onto corresponding bond pad landings serving as anchor pads;
   conductively bonding the active device die on the heat sink device assembly to other corresponding bond pad landings; and
   encapsulating the heat sink device assembly and lead frame array in a molding compound; and
   wherein an under-side surface of the heat sink device assembly and the opposite lower surfaces of the bond pad landings are exposed;
   wherein the bond pad landings surround each die placement area on the lead frame array; and
   wherein the at least two mounting tabs are four mounting tabs, wherein two mounting tabs are on one side of the heat sink portion, and two other mounting tabs are on an opposite other side of the heat sink portion.

2. The method as recited in claim 1, wherein die bonding is an elevated-temperature process selected from at least one of the following: solder, eutectic, Ag-sinter, and conductive adhesive.

3. The method as recited in claim 1, wherein attaching the at least two mounting tabs to the anchor pads is one of the following: conductive gluing, soft soldering, eutectic soldering, copper-tin soldering, laser welding, and riveting.

4. The method as recited in claim 1, wherein conductively bonding the active device die to the other corresponding bond pad landings includes at least one of the following: wire bonding, ribbon bonding, and clip bonding.

5. The method as recited in claim 1, wherein the lead frame is selected from one of the following package types: HVQFN (heatsink very-thin quad flat no-leads), QFN (quad flat no-leads), aQFN (advanced quad flat no lead), LLGA (leadless land grid array), TLA (thermal leadless array), EFLGA (electroforming type land grid array), TLEM (transcription lead of electroforming method), HSOP (heat slug outline package), and HQFP (heatsink quad flat pack).

6. A method for preparing an integrated circuit (IC) device, the method comprising:
   providing a heat sink array having a top-side surface and an under-side surface, the heat sink array having a plurality of heat sink portions with at least two mounting tabs, the plurality of heat sink portions held fixedly together in the heat sink array by the at least two mounting tabs coupled by connecting bars to one another, each heat sink portion having a die placement area on the top-side surface;
   die bonding a plurality of active device die onto the die placement areas in the plurality of heat sink portions, thereby forming a plurality of device die/heat sink assemblies;
   singulating the plurality of device die/heat sink assemblies into individual heat sink device assemblies;
   providing a lead frame array with a plurality of die placement areas each die placement area with bond pad landings, the bond pad landings situated about the each die placement area on one or multiple sides, the bond pad landings having upper surfaces and opposite lower surfaces;
   placing a heat sink device assembly of the individual heat sink device assemblies in a die placement area of the plurality of die placement areas of the lead frame array and attaching the at least two mounting tabs onto corresponding bond pad landings serving as anchor pads;

conductively bonding the active device die on the heat sink device assembly to other corresponding bond pad landings;

encapsulating the heat sink device assembly and lead frame array in a molding compound; and wherein an under-side surface of the heat sink device assembly and the opposite lower surfaces of the bond pad landings are exposed;

wherein the bond pad landings surround each die placement area on the lead frame array; and wherein the at least two mounting tabs are four mounting tabs, wherein two mounting tabs are on one side of the heat sink portion, and two other mounting tabs are on an opposite other side of the heat sink portion.

7. The method as recited in claim 6, wherein die bonding is an elevated-temperature process selected from at least one of the following: solder, eutectic, Ag-sinter, and conductive adhesive.

8. The method as recited in claim 6, wherein attaching the at least two mounting tabs to the anchor pads is one of the following: conductive gluing, soft soldering, eutectic soldering, copper-tin soldering, laser welding, and riveting.

9. The method as recited in claim 6, wherein conductively bonding the active device die to the other corresponding bond pad landings includes at least one of the following: wire bonding, ribbon bonding, and clip bonding.

10. The method as recited in claim 6, wherein the lead frame is selected from one of the following package types: HVQFN (heatsink very-thin quad flat no-leads), QFN (quad flat no-leads), aQFN (advanced quad flat no lead), LLGA (leadless land grid array), TLA (thermal leadless array), EFLGA (electroforming type land grid array), TLEM (transcription lead of electroforming method), HSOP (heat slug outline package), and HQFP (heatsink quad flat pack).

11. The method of claim 6, wherein the plurality of heat sink portions is of a first thickness and the mounting tabs and the connecting bars are of a second thickness, the first thickness about twice that of the second thickness.

* * * * *